(12) United States Patent
Watanabe et al.

(10) Patent No.: US 6,915,942 B2
(45) Date of Patent: Jul. 12, 2005

(54) METHOD OF MANUFACTURING MOUNT STRUCTURE WITHOUT INTRODUCING DEGRADED BONDING STRENGTH OF ELECTRONIC PARTS DUE TO SEGREGATION OF LOW-STRENGTH/LOW-MELTING POINT ALLOY

(75) Inventors: Shinji Watanabe, Tokyo (JP); Hiroshi Sakai, Tokyo (JP); Motoji Suzuki, Tokyo (JP); Makoto Igarashi, Niigata (JP); Akihiro Tanaka, Niigata (JP)

(73) Assignee: NEC Corporation (JP)

( * ) Notice: Subject to any disclaimer, the term of this patent is extended or adjusted under 35 U.S.C. 154(b) by 318 days.

(21) Appl. No.: 10/156,098

(22) Filed: May 29, 2002

(65) Prior Publication Data

US 2003/0005581 A1 Jan. 9, 2003

(30) Foreign Application Priority Data

Jun. 1, 2001 (JP) .................................. 2001-166970
Feb. 25, 2002 (JP) .................................. 2002-048026

(51) Int. Cl.⁷ .............................................. B23K 31/02
(52) U.S. Cl. .................................. 228/200; 228/248.1
(58) Field of Search .......................... 228/248.1, 248.5, 228/200, 46

(56) References Cited

U.S. PATENT DOCUMENTS

| 4,832,249 A | | 5/1989 | Ehler |
| 5,433,368 A | | 7/1995 | Spigarelli |
| 5,560,531 A | * | 10/1996 | Ruszowski |
| 5,918,795 A | * | 7/1999 | Yamaguchi et al. |
| 5,928,404 A | | 7/1999 | Paruchuri et al. |

(Continued)

FOREIGN PATENT DOCUMENTS

| CN | 1198117 A | 11/1998 |
| EP | 0 855 242 A1 | 7/1998 |
| EP | 0 875 331 A2 | 11/1998 |
| JP | 62 054996 A | 3/1987 |
| JP | 01 312 892 | 12/1989 |
| JP | 2-307671 | 12/1990 |
| JP | 3-268386 | 11/1991 |
| JP | 4-109695 | 4/1992 |
| JP | 5-48376 | 6/1993 |
| JP | 06 120 652 | 4/1994 |
| JP | 08 078837 | 3/1996 |
| JP | 9-29480 | 2/1997 |
| JP | 9-82751 | 3/1997 |
| JP | 09 206 983 | 8/1997 |
| JP | 09216089 * | 8/1997 |
| JP | 9-266373 | 10/1997 |
| JP | 11-26924 | 1/1999 |
| JP | 11-138292 | 5/1999 |
| JP | 11-245079 | 9/1999 |
| JP | 11-354919 | 12/1999 |
| JP | 2000 188464 | 7/2000 |
| JP | 2000-349433 | 12/2000 |

(Continued)

OTHER PUBLICATIONS

Japanese Office Action dated Oct. 1, 2003 (w/ English trnaslation of relevant portion).
Korean Office Action dated Jun. 29, 2004 (w/ English trnaslation of relevant portion).
European Search Report issued Aug. 2, 2004.
Chinese Office Action issued Oct. 29, 2004.

*Primary Examiner*—Kiley S. Stoner
(74) *Attorney, Agent, or Firm*—Dickstein, Shapiro, Morin & Oshinsky, LLP.

(57) ABSTRACT

A method of manufacturing a mount structure according to the present invention which forcedly cools down a melted solder paste on a printed circuit board at a cooling speed of 1.5° C./second or higher to solidify the solder paste when an electronic part is mounted on the printed circuit board by reflow processing.

11 Claims, 9 Drawing Sheets

U.S. PATENT DOCUMENTS

| | | | |
|---|---|---|---|
| 6,077,477 A * | 6/2000 | Sakai et al. | |
| 6,095,403 A | 8/2000 | Akin et al. | |
| 6,204,490 B1 | 3/2001 | Soga et al. | |
| 6,214,131 B1 * | 4/2001 | Hua | 148/24 |
| 6,230,962 B1 * | 5/2001 | Leicht | |
| 6,231,691 B1 * | 5/2001 | Anderson et al. | |
| 6,267,823 B1 * | 7/2001 | Yamaguchi et al. | |
| 6,340,110 B1 | 1/2002 | Nakamura et al. | |
| 6,428,745 B2 * | 8/2002 | Yamaguchi et al. | |
| 6,575,352 B2 * | 6/2003 | Takahashi et al. | |
| 6,585,149 B2 * | 7/2003 | Nakatsuka et al. | |
| 6,616,032 B1 * | 9/2003 | Gasse et al. | |
| 6,617,195 B1 * | 9/2003 | Master et al. | |
| 6,642,485 B2 * | 11/2003 | Goenka et al. | 219/400 |
| 6,648,216 B2 * | 11/2003 | Yamaguchi et al. | |
| 6,651,870 B2 * | 11/2003 | Teshima et al. | |
| 6,726,087 B2 * | 4/2004 | Diehm et al. | 228/229 |
| 2001/0018030 A1 * | 8/2001 | Yamaguchi et al. | 420/561 |
| 2001/0025875 A1 * | 10/2001 | Yamaguchi et al. | 228/224 |
| 2002/0011511 A1 * | 1/2002 | Takahashi et al. | 228/223 |
| 2002/0093096 A1 * | 7/2002 | Tago et al. | 257/738 |
| 2003/0005581 A1 * | 1/2003 | Watanabe et al. | 29/739 |
| 2003/0096453 A1 * | 5/2003 | Wang et al. | 438/108 |
| 2003/0121959 A1 * | 7/2003 | Yamaguchi et al. | 228/256 |
| 2003/0156969 A1 * | 8/2003 | Choi et al. | 420/560 |
| 2003/0201310 A1 * | 10/2003 | Nakatsuka et al. | 228/207 |
| 2004/0045642 A1 * | 3/2004 | Bonet | 148/528 |
| 2004/0056067 A1 * | 3/2004 | Yamaguchi et al. | 228/33 |
| 2004/0112478 A1 * | 6/2004 | Bieler et al. | 148/538 |
| 2004/0166370 A1 * | 8/2004 | Mizoguchi et al. | 428/692 |

FOREIGN PATENT DOCUMENTS

| | | | |
|---|---|---|---|
| JP | 2001-7507 | | 1/2001 |
| JP | 2001-308507 | | 11/2001 |
| JP | 2001-358456 | | 12/2001 |
| KR | 2000-0005917 | | 1/2000 |
| KR | 2000-0062454 | | 10/2000 |
| WO | WO97/28923 | * | 8/1997 |

* cited by examiner

METHOD OF MANUFACTURING MOUNT STRUCTURE WITHOUT INTRODUCING DEGRADED BONDING STRENGTH OF ELECTRONIC PARTS DUE TO SEGREGATION OF LOW-STRENGTH/LOW-MELTING POINT ALLOY

BACKGROUND OF THE INVENTION

1. Field of the Invention

The present invention relates to a method of manufacturing a mount structure having a variety of electronic parts mounted on a printed circuit board (hereinafter called the PCB) by soldering, and to a mount structure, and more particularly, to a method of manufacturing a mount structure having electronic parts soldered on at least one side of a PCB by reflowing, and to a mount structure.

2. Description of the Prior Art

Conventionally, soldering has been used for mounting a variety of electronic parts on a PCB. In the following, a method of mounting electronic parts using soldering will be described below with reference to the drawings.

Referring first to FIGS. 1A–1F, description will be made on an example of double-sided reflow process for soldering electronic parts on both sides of a PCB by reflowing.

First, solder paste 81 is printed on a land (not shown) of PCB 80 using a printing mask (not shown) which is provided with an opening only at a position corresponding to the land (FIG. 1A).

Next, surface mounted part 82 such as a chip part, QFP (Quad Flat Package), SOP (Small Outline Package) or the like is loaded on solder paste 81 printed on the land (FIG. 1B).

Then, solder paste 81 is melted by passing PCB 80 having surface mounted part 82 loaded thereon through a high temperature furnace to solder leads of surface mounted part 82 with a copper foil of PCB 80 (FIG. 1C). Through the respective previous steps, surface mounted part 82 has been soldered on one side of PCB 80 by reflowing.

Next, PCB 80 is turned upside down, and solder paste 83 is printed on the other side of PCB 80 on which no electronic part has been mounted (FIG. 1D), and surface mounted part 84 is loaded on printed solder paste 83 (FIG. 1E) by similar steps as those illustrated in FIGS. 1A, 1B. Subsequently, surface mounted part 84 is soldered by passing PCB 80 through the furnace in a manner similar to the step illustrated in FIG. 1C (FIG. 1F).

Electronic parts which cannot withstand the high temperature in the furnace for the aforementioned reflow processing are manually soldered after the reflow processing is terminated.

Referring next to FIG. 2, description will be made on an example of a reflow/flow composite process for soldering electronic parts on one side of a PCB by reflowing and then soldering electronic parts on the other side of the PCB by flowing.

First, in steps similar to those in FIGS. 1A, 1B, solder paste 81 is printed (FIG. 2A), and surface mounted part 82 is loaded on printed solder paste 81 (FIG. 2B) on one side of PCB 80. Then, PCB 80 is passed through a furnace to solder surface mounted part 82 in a step similar to that in FIG. 1C (FIG. 2C). Through the respective previous steps, surface mounted part 82 has been soldered on the one side of PCB 80 by reflowing.

Next, from the one side of PCB 80 on which surface mounted part 82 is mounted, leads of electronic part 85 (hereinafter called the throughhole part 85) are passed through throughholes of PCB 80 to load throughhole part 85 (FIG. 2D)

Subsequently, PCB 80 having throughhole part 85 loaded thereon is passed above a solder bath within the furnace. Then, melted solder 86 is sprayed from the solder bath toward leads of throughhole part 85 on the other side of PCB 80 to solder the leads of throughhole part 85 with a copper foil of PCB 80 (FIG. 2E).

Electronic parts which cannot withstand the high temperature in the furnace for the aforementioned reflow processing, electronic parts which are mounted through the flow processing with difficulties are manually soldered after the flow processing is terminated.

The conventional method of mounting electronic parts described above has generally used an Sn—Pb based solder. However, this Sn—Pb based solder contains Pb, a poisonous heavy metal, which adversely affects the earth environment if devices are not appropriately disposed after use. For this reason, in recent years, a Pb-free solder (Pb-less solder), which does not contain Pb, is desirably used for solving the foregoing problem to obviate the environmental pollution.

Generally, an Sn—Ag based solder is widely known as the Pb-free solder. Since the Sn—Ag based solder exhibits relatively stable characteristics, it can also ensure the reliability as high as before when it is used for mounting electronic parts as a substitute for the Sn—Pb based solder. However, the Sn—Ag based solder has a melting point at slightly lower than 220° C. which is higher than the melting point of the Sn—Pb based solder, i.e., approximately 183° C. This higher melting point makes it difficult to utilize a mounting apparatus and a mounting method for use with the Sn—Pb based solder as they are. Particularly, while typical electronic parts withstand approximately 230° C. of temperature, such electronic parts may be heated in some cases to 240° C. or higher if the Sn—Ag based solder, which has the melting point as high as 220° C., is melted within the furnace for soldering. Therefore, the use of the Sn—Ag based solder for mounting a variety of electronic parts implies a problem that the electronic parts are required to withstand higher temperatures.

Another Pb-free solder, unlike the Sn—Ag based solder having a high melting point, is an Sn—Zn based solder, the melting point of which is slightly lower than 200° C., so that if this Sn—Zn based solder is used to mount electronic parts, conventional facilities and electronic parts can be used as they are.

However, the aforementioned Sn—Zn based solder has a problem of high susceptibility of Zn to oxidization, and poor wettability, as compared with the conventionally used Sn—Pb based solder. This causes difficulties in ensuring the soldering quality and reliability similar to before if electronic parts are mounted by the Sn—Zn based solder using conventional facilities and mounting method.

As a method of improving the wettability of the Sn—Zn based solder, it is generally known to contain Bi in the Sn—Zn based solder, and techniques have been disclosed somewhere for performing reflow processing using such an Sn—Zn—Bi based solder.

However, when the Sn—Zn—Bi based solder is reflowed using electronic parts having leads applied with the currently most general Sn—Pb plating, the conventional reflow processing experiences segregation of Sn—Zn—Pb and Sn—Pb—Bi, resulting from the reaction of Pb which is a main component of the Sn—Pb plating with Sn—Zn—Bi which are components of the Sn—Zn—Bi based solder, in regions around interfaces between lands and solders, leading to the formation of low-strength/low-melting point alloy layers. Consequently, the low-strength/low-melting point alloy layers in these interface regions adversely affect the mounting quality and reliability.

Particularly, in the second reflow processing in the aforementioned double-sided reflow process, and in the flow processing in the reflow/flow composite process, the segregation of low-strength/low-melting point alloys such as Sn—Zn—Pb, Sn—Pb—Bi and the like advances more on the side on which electronic parts have been mounted first. Therefore, the second reflow processing in the aforementioned double-sided reflow process and the flow processing in the reflow/flow composite process experience a phenomenon that the low-strength/low-melting point alloys alone remain unsolidified on interfaces between lands and solders in a cooling step for cooling down the solders. This causes a higher susceptibility to partial delamination or complete failure in bonding of electronic parts in the interface regions when a PCB is bowed or twisted. This phenomenon is prominently found in leads that are positioned at four corners of electronic parts such as QFP, SOP and the like, which are highly susceptible to stresses caused by a bowed or twisted PCB.

SUMMARY OF THE INVENTION

It is an object of the present invention to provide a method of manufacturing a mount structure which is capable of preventing the formation of a low-strength/low-melting point alloy layer near the interfaces between a land and a solder to sufficiently ensure the quality and reliability of solder-based bonding, and the mount structure.

To achieve the above object, a method of manufacturing a mount structure according to the present invention forcedly cools down and solidifies a melted solder paste on a printed board at a cooling speed of 1.5° C./second or higher.

In this way, the solder paste can be solidified in a uniform composition before a low-strength/low-melting point alloy segregates in regions around interfaces between lands and solders on the printed board. This can suppress the formation of low-strength/low-melting point alloy layers in regions around interfaces between lands and solders on the printed board, and ensure the quality and reliability of the solder-based bonding. For example, when an Sn—Zn—Bi based alloy is used as the solder paste, from a viewpoint of improvement on the wettability of a Pb-free Sn—Zn based solder, for soldering an electronic part having leads covered with a plating film containing Pb, it is possible to prevent the segregation of Sn—Zn—Pb (the melting point of which is 177° C.) and Sn—Pb—Bi (the melting point of which is 98° C.).

When an Sn—Zn—Bi based alloy containing 3% or less of Bi is used as the solder paste, it is possible to further suppress the segregation of Sn—Pb—Bi. In addition, the flexibility of the Sn—Pb—Bi based solder can be increased when it contains less than 3 wt % of Bi, so that it is also possible to improve the endurance to environmental changes such as the ambient temperature.

Also, When two or more kinds of solder powders are blended into a solder paste for use in the present invention, the resulting solder paste exhibits a larger temperature difference between the liquidus and solidus, thereby making it possible to suppress the chip build-up defect.

For conducting a double-sided reflow process including a first reflow step on one side of a printed board and a second reflow step on the other side of the printed board, solders on both sides of the printed board are forcedly cooled down and solidified from a melted state at a cooling speed of 1.5° C./second or higher. In this event, the segregation of Sn—Zn—Pb and Sn—Pb—Bi is prevented in regions around interfaces of lands and solders on the one side of the printed board on which electronic parts have been previously mounted by the first reflow step, even after the printed board has undergone the second reflow step, thereby making it possible to ensure the quality and reliability of the solder-based bonding.

For conducting a reflow/flow composite process including a reflow step on one side of a printed board and a flow step on the other side of the printed board, the flow processing is performed during the flow step while a solder on the one side of the printed circuit board is maintained at temperatures of 170° C. or lower. In this event, Sn—Zn—Pb formed in very small quantities in the reflow step can be prevented from melting again during the flow step on the one side of the printed board on which electronic parts have been previously mounted by the reflow step. It is therefore possible to ensure the quality and reliability of the solder-based bonding on the one side of the print board even after the printed board has undergone the flow step.

The above and other objects, features, and advantages of the present invention will become apparent from the following description with reference to the accompanying drawings which illustrate examples of the present invention.

DESCRIPTION OF THE PREFERRED EMBODIMENTS

First Embodiment

In a first embodiment, a mount structure is manufactured by a double-sided reflow process for soldering electronic parts on both sides of a PCB by reflowing.

A reflow apparatus for use in the reflow processing according to the first embodiment applies the reflow processing to a PCB which has a variety of electronic parts mounted on a solder paste printed on lands in a preceding step. The reflow apparatus employs an Sn—Zn—Bi based alloy, which is an Sn—Zn based alloy containing Bi, as the solder paste. An electronic part having leads covered with a plating film containing Pb is used as one of the electronic parts mounted on the PCB.

Figure 1A:
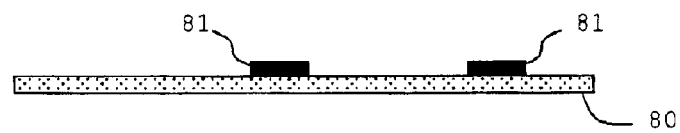
FIG. 1A is a diagram for explaining an outline of a double-sided reflow process.
Figure 1B:
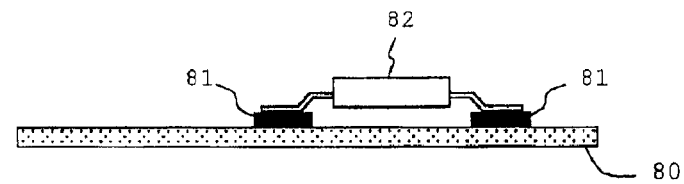
FIG. 1B is a diagram for explaining an outline of a double-sided reflow process.
Figure 1C:
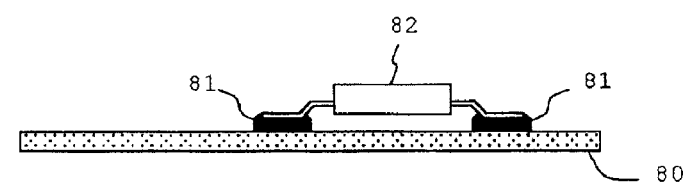
FIG. 1C is a diagram for explaining an outline of a double-sided reflow process.
Figure 1D:
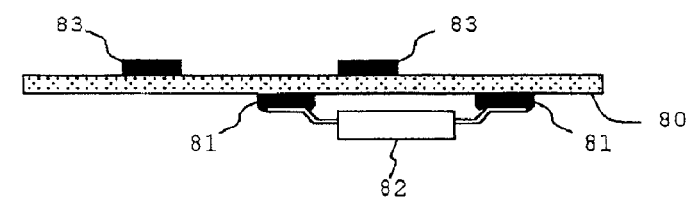
FIG. 1D is a diagram for explaining an outline of a double-sided reflow process.
Figure 1E:
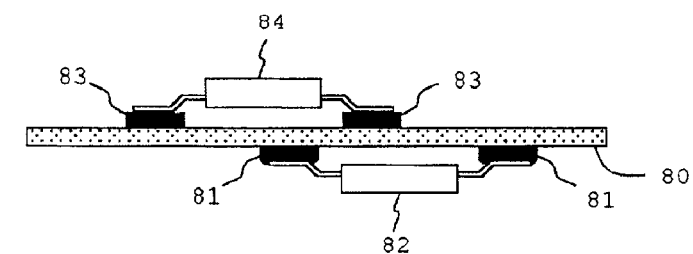
FIG. 1E is a diagram for explaining an outline of a double-sided reflow process.
Figure 1F:
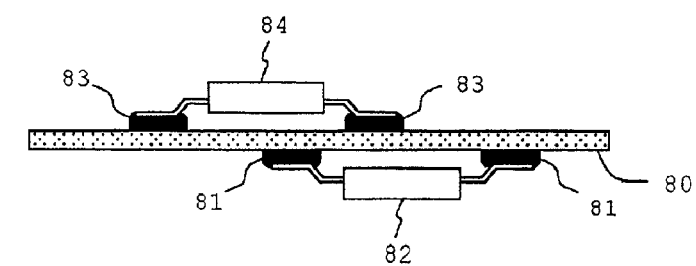
FIG. 1F is a diagram for explaining an outline of a double-sided reflow process.
Figure 2A:
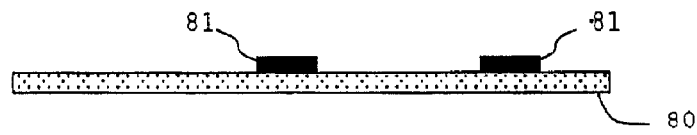
FIGS. 2A is a diagram for explaining an outline of a reflow/flow composite process.
Figure 2B:
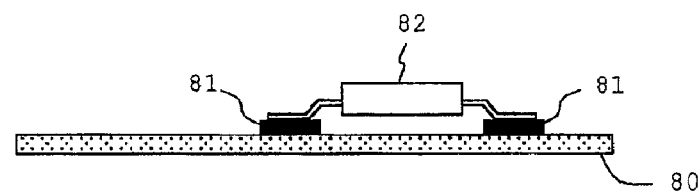
FIGS. 2B is a diagram for explaining an outline of a reflow/flow composite process.
Figure 2C:
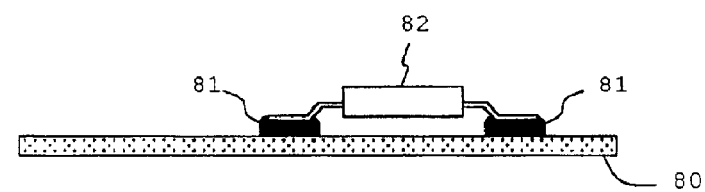
FIGS. 2C is a diagram for explaining an outline of a reflow/flow composite process.
Figure 2D:
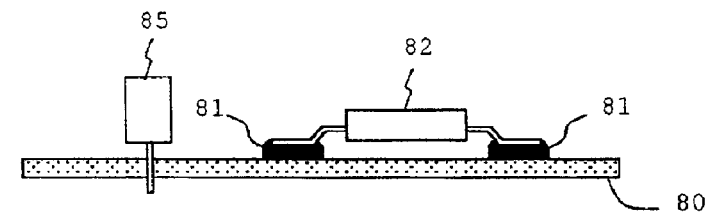
FIGS. 2D is a diagram for explaining an outline of a reflow/flow composite process.
Figure 2E:
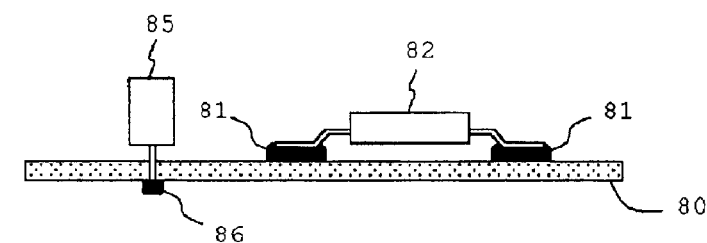
FIGS. 2E is a diagram for explaining an outline of a reflow/flow composite process.
Figure 3:
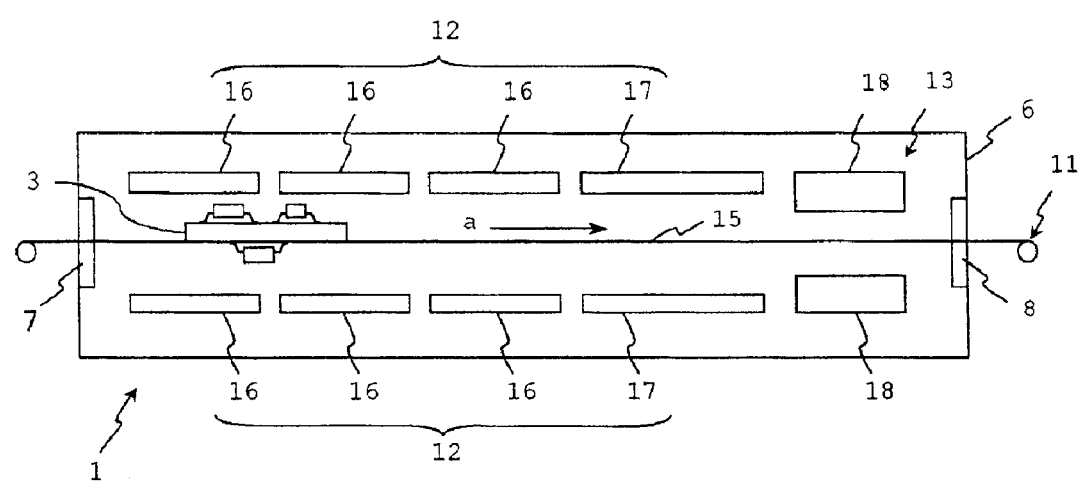
FIG. 3 is a schematic diagram of a reflow apparatus used in a first and a second embodiment of the present invention.

As illustrated in FIG. 3, reflow apparatus 1 for use in the reflow processing according to the first embodiment comprises furnace 6 for performing the reflow processing on PCB 3. Furnace 6 is provided with an inlet port 7 at one end side for introducing PCB 3 subjected to the reflow processing, and an outlet port 8 on the other end side for removing reflowed PCB 3. The airtightness is ensured within furnace 6.

Reflow apparatus 1 also comprises conveyer mechanism 11 for conveying PCB 3 within furnace 6; heating units 12 for heating and melting the solder paste on PCB 3; and cooling units 13 for cooling down and solidifying the heated and melted solder paste on PCB 3.

Conveyer mechanism 11 has carrier 15 on which PCB 3 is carried; and a driving mechanism (not shown) for driving carrier 15 in a direction indicated by an arrow a in FIG. 3 along a conveying path at a predetermined conveying speed. The conveying path is provided for carrier 15 to move from inlet port 7 to outlet port 8 within furnace 6. This conveyer mechanism 11 conveys PCB 3, for example, at a conveying speed of approximately 0.7 m/minute.

Heating units 12 and cooling units 13 are respectively arranged along the conveying path within furnace 6. Heating units 12 are arranged near inlet port 7 at positions opposite to each other with the conveying path intervening therebetween. Cooling units 13 in turn are arranged near outlet port 8 at positions opposite to each other with the conveying path intervening therebetween.

Each of heating units 12 has pre-heater 16 for preliminarily heating the solder paste to a predetermined temperature and maintaining the heated solder paste; and heater 17 for heating the solder paste to the melting point thereof or higher for melting the solder paste, in this order along the conveying path of conveyer mechanism 11.

Each of cooling units 13 has cooling fan 18 for sending cooling air to PCB 3; and a cooling circuit (not shown) for cooling the cooling air sent from cooling fan 18. The cooling circuit is configured to circulate a predetermined coolant. Then, cooling units 13 are set to cool down and solidify the solder paste on PCB 3 heated to approximately 210° C. or higher at a cooling speed of 1.5° C./second or higher.

Figure 4:
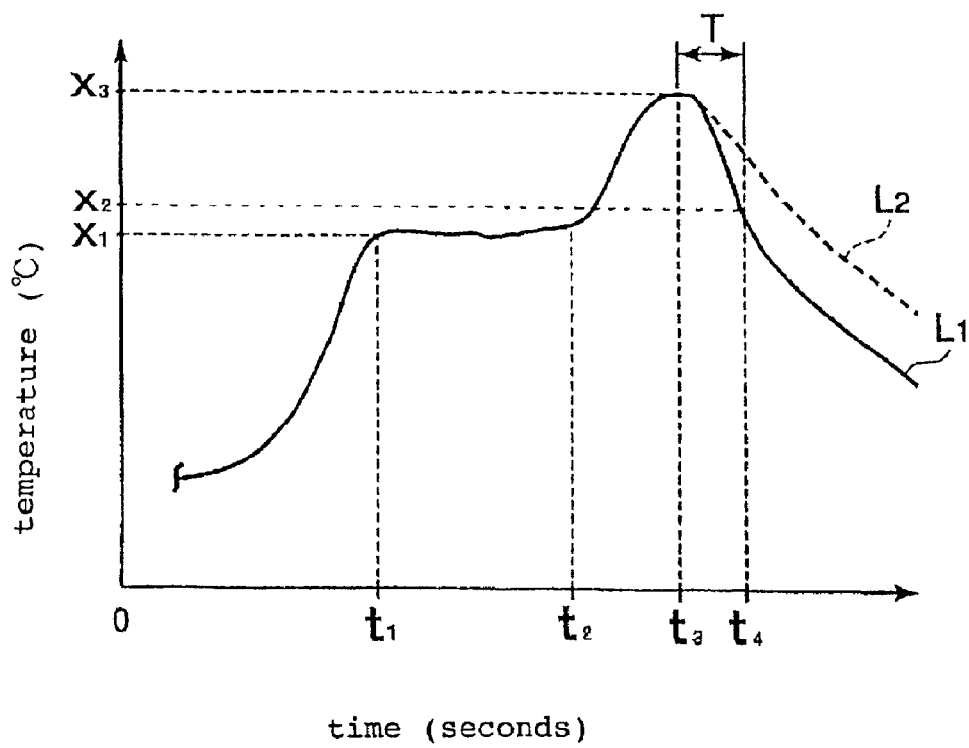
FIG. 4 is a graph showing a temperature change curve within the reflow apparatus illustrated in FIG. 3.

In the following, description will be made on the double-sided reflow process using reflow apparatus 1 illustrated in FIG. 3. In parallel, description will be made on a change in temperature of a solder paste within reflow apparatus 1 with reference to FIG. 4. In FIG. 4, the vertical axis represents the temperature (° C.) of a solder paste near a lead of an electronic part on PCB 3; and the horizontal axis represents the time (seconds). Also, in FIG. 4, a solid line $L_1$ indicates a solder paste temperature change curve when using reflow apparatus 1 according to the first embodiment, and a broken line $L_2$ indicates a solder paste temperature change curve when using a conventional reflow apparatus.

First, PCB 3 which has a solder paste printed thereon and electronic parts mounted on one side thereof is introduced into furnace 6 of reflow apparatus 1.

PCB 3 introduced into furnace 6 is conveyed along the conveying path by conveyer mechanism 11, and the solder paste on PCB 3 is heated by heating units 12.

As indicated by solid line $L_1$ in FIG. 4, when an Sn—Zn—Bi based solder, the melting point of which is slightly lower than 200° C., is used, for example, as the solder paste printed on PCB 3, the solder paste on PCB 3 introduced into furnace 6 from inlet port 7 by conveyer mechanism 11 is heated by pre-heaters 16 of heating units 12 to approximately 150° C. to 170° C. (temperature $x_1$), for example, after 135 to 145 seconds (time $t_1$) from the introduction of PCB 3. The solder paste on PCB 3 heated to approximately temperature $x_1$ is maintained at this temperature by pre-heaters 16 for 80 to 100 seconds.

Then, the pre-heating is completed after 215 to 245 seconds (time $t_2$) from the introduction of PCB 3, and PCB 3 maintained at temperature $x_1$ is further conveyed by conveyer mechanism 11. The solder paste on PCB 3 is heated to approximately 210° C. (temperature $x_3$) or higher and melted by heaters 17 of heating units 12 after 265 to 305 seconds (time $t_3$) from the introduction of PCB 3.

Subsequently, PCB 3 is further conveyed by conveyer mechanism 11, and the melted solder paste on PCB 3 is cooled down to approximately 190° C. (temperature $x_2$) or lower by cooling fans 18 of cooling units 13 in approximately 13 seconds (cooling time T). In this event, cooling units 13 cool down and solidify the solder paste on PCB 3 at a cooling speed of 1.5° C./second or higher.

On PCB 3, the melted solder paste is cooled down to the melting point or lower and solidified by cooling units 13 to mount electronic parts. Cooled PCB 3 is removed from outlet port 8 after 278 to 318 seconds (time $t_4$) from the introduction, and left at a room temperature for a predetermined time. PCB 3 is prevented from the formation of low-strength/low-melting point alloy layers on the interfaces of lands and solders due to the segregation of Sn—Zn—Pb (the melting point of which is 177° C.), and Sn—Pb—Bi (the melting point of which is 98° C.) made from Pb, which is a component of the plating films on the leads, and Sn—Zn—Bi, which are components of the Sn—Zn—Bi based solder. Consequently, the electronic parts are securely bonded on PCB 3.

On the other hand, as indicated by broken line $L_2$ in FIG. 4, the conventional reflow processing cools down and solidifies the solder paste on PCB 3 by cooling units 13 at a cooling speed of approximately 0.5 to 0.8° C./second. On PCB 3 on which the solder paste was cooled down and solidified at this cooling speed, Sn—Zn—Pb and Sn—Pb—Bi segregate on interfaces between lands and solders, resulting in the formation of low-strength/low-melting point alloy layers on the interfaces.

Specifically, the reflow processing according to the first embodiment rapidly cools down and solidifies the solder paste at a cooling speed approximately twice or three times higher than the conventional reflow processing, as can be appreciated from the slope of the cooling curve $L_1$ presenting the cooling speed, which is more abrupt than the slope of the cooling curve $L_2$ according to the conventional reflow processing. For this reason, Pb diffuses from the plating films on the leads of the electronic parts mounted on PCB 3, so that the solder paste can be solidified in the uniform composition before Sn—Zn—Pb and Sn—Pb—Bi segregate on the interfaces between lands and solders.

Since this prevents the formation of the low-strength/low-melting point alloy layers due to the segregation of Sn—Zn—Pb and Sn—Pb—Bi on the interfaces of lands and solders, electronic parts mounted on one side of PCB 3 are bonded with a sufficient strength ensured by the solder, thereby preventing defective soldering.

Subsequently, furnace 6 of reflow apparatus 1 receives PCB 3 which has electronic parts mounted on one side thereof by reflowing in the preceding step and has electronic parts loaded on a solder paste printed on the other side thereof.

Afterwards, the reflow processing is applied to the other side of PCB 3 in a manner similar to the aforementioned reflow processing on the one side of PCB 3 within furnace 6 of reflow apparatus 1. Consequently, the electronic parts mounted on the other side of PCB 3 are also bonded with a sufficient strength ensured by the solder, thereby preventing defective soldering.

In this event, the solder paste on leads of electronic parts which have been previously mounted by reflowing on the one side of PCB 3 is also cooled down rapidly by cooling unit 13 at a cooling speed of 1.5° C./second or higher. Therefore, even if the solder paste on the one side of PCB 3 is melted again by the heating of heating units 12, the solder paste is rapidly cooled down and solidified. As such, the electronic parts previously mounted on the one side of PCB 3 are bonded with a sufficient strength ensured by the solder, thereby preventing defective soldering even after PCB 3 has undergone the reflow processing on the other side thereof.

It should be noted that in the second reflow processing on the other side of PCB 3, entire PCB 3 has a larger thermal capacitance than during the first reflow processing, due to the influence of electronic parts mounted thereon in the first reflow processing on the one side of PCB 3, making the temperature of the solder paste less prone to cooling down. For this reason, if cooling units 13 are simply set identically for the first reflow processing and second reflow processing, the cooling speed will be lower in the second reflow processing. It is therefore desirable to set the cooling units 13 such that the cooling speed is higher in the second reflow processing than in the first reflow processing.

In the reflow processing according to the first embodiment, the cooling speed of cooling units 13 is set to 1.5° C./second or higher to prevent the segregation of Sn—Zn—Pb (the melting point of which is 177° C.), and Sn—Pb—Bi (the melting point of which is 98° C.). Among others, the segregation of Sn—Pb—Bi can be further suppressed by reducing the content of Bi in the Sn—Zn—Bi based solder to less than 3 wt %.

Figure 5:
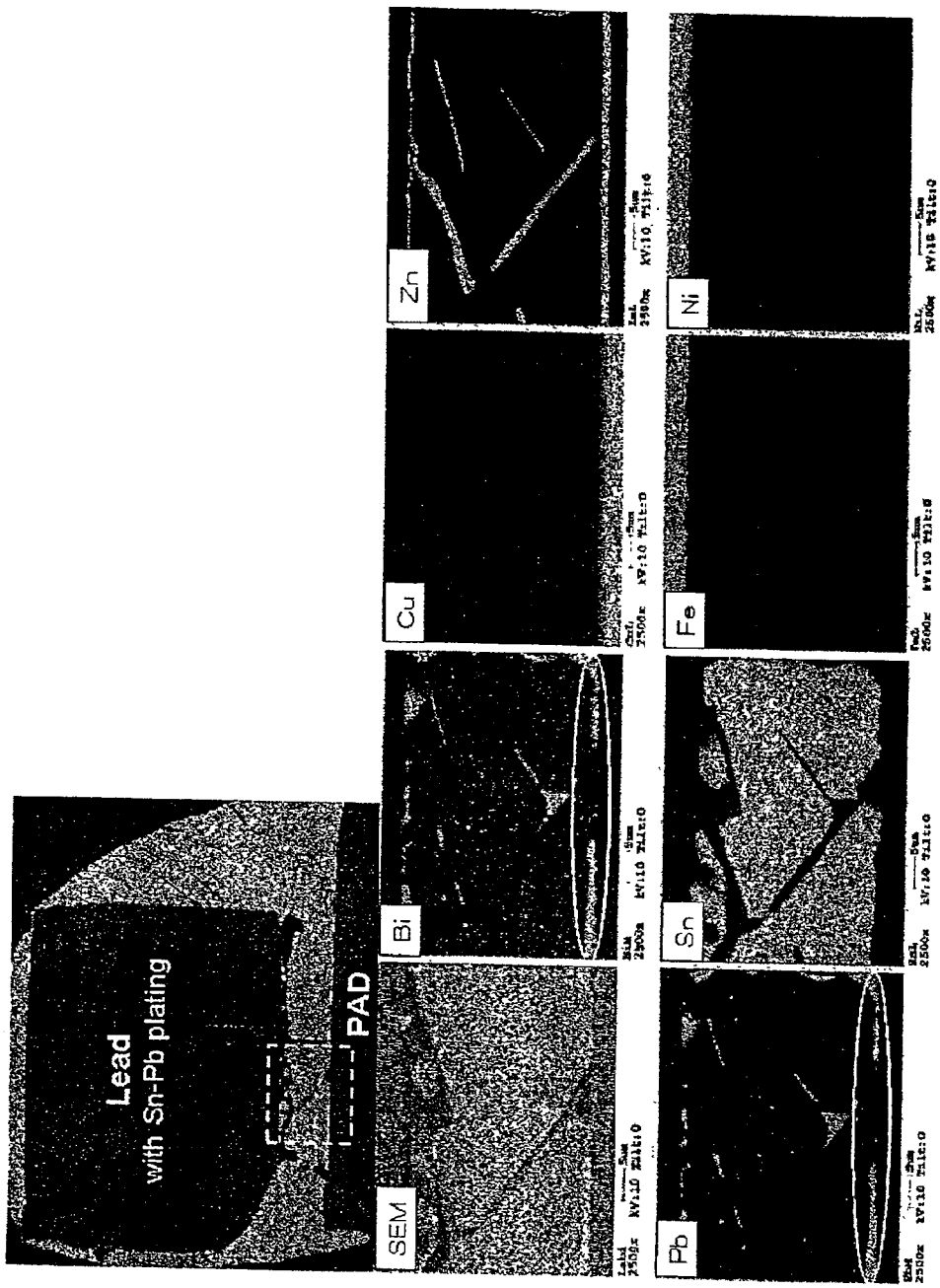
FIG. 5 is a diagram for explaining the composition of a portion of a lead of an electronic part connected by soldering.
Figure 6:
FIG. 6 is an enlarged view showing the portion of the lead of the electronic part connected by soldering in FIG. 5.

Referring now to FIGS. 5 and 6, description will be made on how a lead of an electronic part is connected by soldering when an Sn—Zn—Bi based solder containing 3 wt % of Bi is used as a solder paste, and an Sn—Pb based alloy is used as a plating film for covering leads of the electronic part.

Referring first to FIG. 5, there is shown the composition of the lead connected by soldering of the electronic part mounted by the first reflow processing on one side of a PCB. FIG. 5 shows the composition before the second reflow processing is performed on the other side of PCB. For confirming an optimal content of Bi for the Sn—Zn—Bi based solder, a reflow apparatus herein used is a conventional reflow apparatus which cools down and solidifies a melted solder paste at a cooling speed on the order of 0.5° C./second to 0.8° C./second. Also, in FIG. 5, the topmost figure shows an enlarged cross-sectional view of a portion of the lead of the electronic part connected by soldering, and a figure labeled "SEM" is a further enlarged cross-sectional view of a portion (PAD) surrounded by a dotted line in the topmost figure. Figures labeled the names of elements such as "Pb" show whether or not associated elements exist in a region shown by the figure labeled "SEM", wherein the elements exist in portions which appear whitish in the figures.

As shown in FIG. 5, it is found that segregation of Sn—Pb—Bi as well as Sn—Zn—Pb occurs from the fact that Bi is detected, though in extremely small quantities, in addition to Sn, Zn, Pb in the portion of the lead of the electronic part connected by soldering. It should be noted that in FIG. 5, Cu, Fe, Ni are also detected, showing that Cu, a component of a copper foil of PCB, and Fe, Ni, components of the lead of the electronic part, are detected.

Referring next to FIG. 6, there is shown an enlarged photomicrograph of the portion of the lead of the electronic part connected by soldering after the second reflow processing is performed on the other side of PCB.

As shown in FIG. 6, it is found that delamination occurred in the portion of the lead connected by soldering of the electronic part which had been mounted by the first reflow processing on the one side of PCB, after the second reflow processing performed on the other side of PCB.

As described above, when choosing the Sn—Zn—Bi based solder which contains 3 wt % of Bi, the segregation of Sb—Pb—Bi occurs other than Sn—Zn—Pb. From the fact that Bi is detected merely in extremely small quantities in this event, a preferred range for the content of Bi is less than 3 wt % for further suppressing the segregation of Sn—Pb—Bi.

However, as shown in Table 1, The Sn—Zn—Bi based solder presents a smaller temperature difference between a liquidus and a solidus as the content of Bi is smaller.

TABLE 1

| Composition | Liquidus | Solidus | Temperature Difference |
| --- | --- | --- | --- |
| Sn-9Zn | 199 | 199 | 0 |
| Sn-8Zn-1Bi | 199 | 192 | 7 |
| Sn-8Zn-3Bi | 197 | 187 | 10 |

Assume, for example, that when an electronic part comprising two electrodes is soldered by reflowing, wherein a solder on one of the two electrodes first starts melting due to a temperature difference on a PCB. In this event, the electronic part is raised up due to the other electrode drawn by a surface tension of the melted solder, thereby giving rise to a so-called chip build-up defect. Thus, a larger temperature difference between the liquidus and solidus is advantageous for suppressing the chip build-up because a smaller amount of solder melts at the beginning to reduce the surface tension of the solder.

Bearing this in mind, in the first embodiment, two or more kinds of solder powders are blended into a paste form when an Sn—Zn—Bi based solder paste is created to adjust the content of Bi to less than 3 wt % in the Sn—Zn—Bi based solder and to increase the temperature difference between the liquidus and solidus.

Specifically, for creating an Sn—Zn—Bi based solder paste containing 2% of Bi, two kinds of solder powders are blended into a paste form, for example, in the following weight ratio to create the solder paste:

1. Sn-8Zn-3Bi: 67 wt %; and
2. Sn-9Zn: 33 wt %

On the other hand, for creating an Sn—Zn—Bi based solder paste containing 1% of Bi, two kinds of solder powders are blended into a paste form, for example, in the following weight ratio to create the solder paste:

1. Sn-8Zn-3Bi: 33 wt %; and
2. Sn-9Zn: 67 wt %

Although the solder pastes created in the foregoing examples contain 1% or 2% of Bi, they exhibit the same temperature difference between the liquidus and solidus as that of Sn-8Zn-3Bi, thus making it possible to reduce the amount of solder when melts at the beginning. Since this can reduce the surface tension of the solder, it is possible to suppress the chip build-up defect. It should be understood that the foregoing compositions and weight ratios are illustrative in any sense, and similar effects to those can be produced as well with other compositions or weight ratios.

As described above, the first embodiment sets the cooling speed of 1.5° C./second or higher for cooling units 13 of reflow apparatus 1 to rapidly cool down and solidify a melted solder paste before the segregation of Sn—Zn—Pb (the melting point of which is 177° C.), and Sn—Pb—Bi (the melting point of which is 98° C.).

Thus, the first embodiment suppresses the formation of low-strength/low-melting point alloy-layers due to the segregation of Sn—Pb—Bi and Sn—Zn—Pb on interfaces of lands and solders, so that the quality and reliability of solder-based bonding are ensured for electronic parts mounted on PCB 3.

When an Sn—Zn—Bi based solder containing less than 3 wt % of Bi is used as a solder paste, it is possible to further suppress the segregation of Sn—Pb—Bi. On the other hand, as the Sn—Zn—Bi based solder has a higher content of Bi, the resulting solder becomes hard and fragile to lose the flexibility, leading to a deteriorated endurance to environmental changes. However, the flexibility of the solder can be improved when the solder contains less than 3 wt % of Bi, so that it is also possible to improve the endurance to environmental changes such as the ambient temperature.

When two or more kinds of solder powders are blended into an Sn—Zn—Bi based solder paste containing less than 3 wt % of Bi, the resulting solder paste exhibits a larger temperature difference between the liquidus and solidus, thereby making it possible to suppress the chip build-up defect.

While the foregoing embodiment has been applied to the double-sided reflow process for mounting electronic parts on both sides of a PCB by reflowing, the present invention is also suitably applied in a single-side reflow process for mounting electronic parts only on one side of a PCB by reflowing.

Also, while the foregoing embodiment has been applied to bonding of an electronic part having leads covered with a plating film containing Pb such as Sn—Pb, the present invention is also suitably applied for bonding other electronic parts which may contain Pb in locations to which a solder paste is applied.

Second Embodiment

In a second embodiment, a mount structure is manufactured by a reflow/flow composite process for soldering electronic parts by reflowing on one side of PCB 3 and subsequently soldering electronic parts by flowing on the other side of PCB 3.

A flow apparatus for use in the flow processing according to the second embodiment applies the flow processing to a PCB which has throughholes through which leads of a variety of electronic parts are inserted to load the electronic parts on the PCB. As a solder for use in the flow processing, an Sn—Ag based alloy, an Sn—Cu based alloy, an Sn—Zn based alloy and the like are preferably used from a viewpoint Pb-free promotion. Also, used as electronic parts mounted on the PCB are those electronic parts which have leads covered with a plating film containing Pb.

Figure 7:
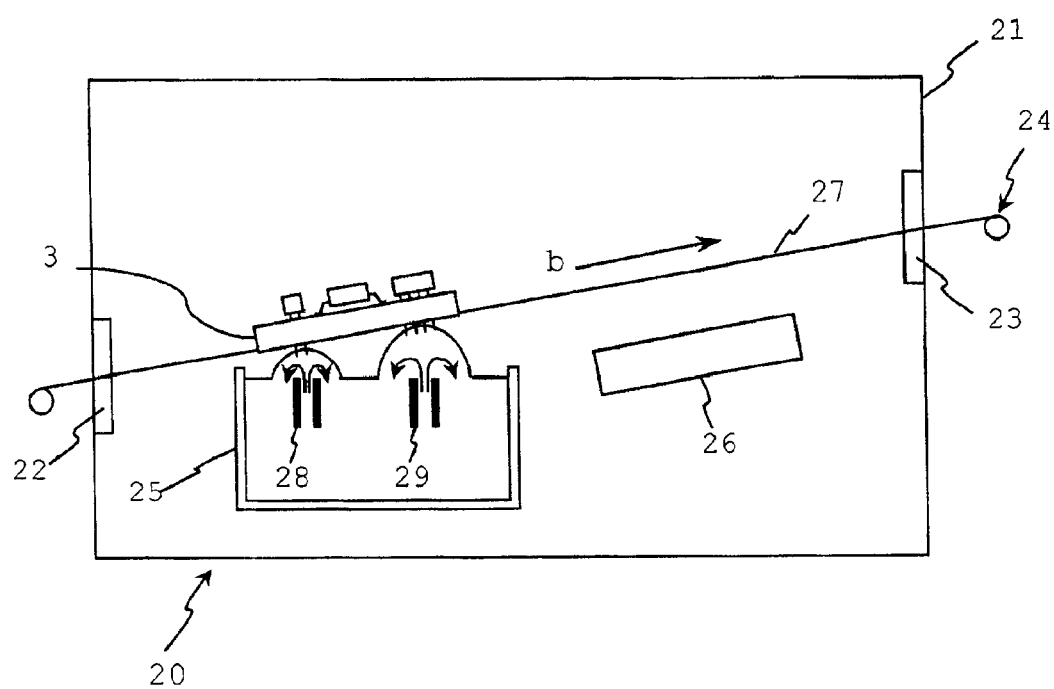
FIG. 7 is a schematic diagram of a flow apparatus used in the second embodiment of the present invention.

As illustrated in FIG. 7, flow apparatus 20 for use in the flow processing according to the second embodiment comprises a furnace 21 for performing the flow processing on PCB 3. Furnace 21 is provided with inlet port 22 on one end side from which PCB 3 is introduced into furnace 21 for the flow processing; and outlet port 23 on the other end side from which flowed PCB 3 is removed from furnace 21.

Flow apparatus 20 further comprises conveyer mechanism 24 for conveying PCB 3 within furnace 21; a solder bath 25 for spraying a melted solder, stored therein, toward PCB 3; and a cooling unit 26 for cooling down and solidifying the melted solder on PCB 3.

Conveyer mechanism 24 comprises carrier 27 on which PCB 3 is carried; and a driving mechanism (not shown) for driving carrier 27 in a direction indicated by an arrow b in FIG. 7 along a conveying path at a predetermined conveying speed. The conveying path is provided for the carrier 27 to move from inlet port 22 to outlet port 23 within furnace 21. This conveyer mechanism 24 conveys PCB 3, for example, at a conveying speed of approximately 1.0 m/minute.

Solder bath 25 is arranged below the conveying path within furnace 21. This solder bath 25 comprises nozzles 28, 29, such that a melted solder is sprayed toward PCB 3 in a double wave mode which is made up of a jet stream of solder from nozzle 28 (primary jet stream) and a jet stream of solder from nozzle 29 (secondary jet stream).

Cooling unit 26 is arranged near outlet port 23 along the conveying path within furnace 21. This cooling unit 26 can be implemented, for example, using a cooling fan, but any other configuration may be employed as long as it can send cooling air to PCB 3.

The reflow apparatus and solder paste for use in the reflow processing according to the second embodiment are similar to those used in the aforementioned first embodiment.

In the following, description will be made on the reflow/flow composite process using reflow apparatus 1 illustrated in FIG. 3 and flow apparatus 20 illustrated in FIG. 4.

First, PCB 3 having electronic parts loaded on a solder paste printed on one side thereof in the preceding step is introduced into furnace 6 of reflow apparatus 1 illustrated in FIG. 3.

PCB 3 introduced into furnace 6 is conveyed by conveyer mechanism 11 along the conveying path, and the solder paste on PCB 3 is heated to its melting point or higher and melted by heating units 12.

PCB 3 is further conveyed by conveyer mechanism 11, and the melted solder paste on PCB 3 is rapidly cooled down and solidified by cooling units 13 at a cooling speed of 1.5° C./second or higher to mount the electronic parts on PCB 3.

In this way, segregation of Sn—Pb—Bi (the melting point of which is 98° C.) and Sn—Zn—Pb (the melting point of which is 177° C.) can be suppressed on the one side of PCB 3. Also, when an Sn—Zn—Bi based solder containing less than 3 wt % of Bi is used as the solder paste, the segregation of Sn—Pb—Bi can be further suppressed. Furthermore, when two or more kinds of solder powders are blended into an Sn—Zn—Bi based solder paste, the chip build-up defect can be suppressed.

Subsequently, furnace 21 of flow apparatus 20 illustrated in FIG. 7 receives PCB 3 which has the electronic parts mounted on the one side thereof by reflowing in the preceding step, and having other electronic parts loaded on the other side with their leads inserted through throughholes of PCB 3 from the one side.

PCB 3 introduced into furnace 21 is conveyed by conveyer mechanism 24 above solder bath 25 along the conveying path within furnace 21.

Then, a melted solder is sprayed from nozzles 28, 29 of solder bath 25 toward PCB 3 while the temperature equal to or lower than 170° C. is maintained in portions connected by soldering of the electronic parts mounted on the one side of PCB 3 by reflowing.

On the one side of PCB 3 on which the electronic parts have been mounted by reflowing, the segregation of Sn—Zn—Pb (the melting point of which is 177° C.) is suppressed by adjusting the cooling speed in the aforementioned reflow processing, but is not fully eliminated, so that a trace of Sn—Zn—Pb exists. For this reason, the temperature equal to or lower than 170° C. is maintained in portions connected by soldering of the electronic parts previously mounted on the one side of PCB 3 during the flow processing to prevent Sn—Zn—Pb existing in very small quantities on the one side of PCB 3 from melting again. This can ensure the quality and reliability of the portions connected by soldering of the electronic parts on the one side of the PCB 3. As described above, the segregation of Sn—Pb—Bi (the melting point of which is 98° C.) can be suppressed by using an Sn—Zn—Bi based solder containing less than 3 wt % of Bi.

Subsequently, PCB 3 is further conveyed by conveyer mechanism 24, and the melted solder on PCB 3 is cooled down to the melting point or lower and solidified by cooling unit 26, thereby mounting the electronic parts on PCB 3.

Figure 8:
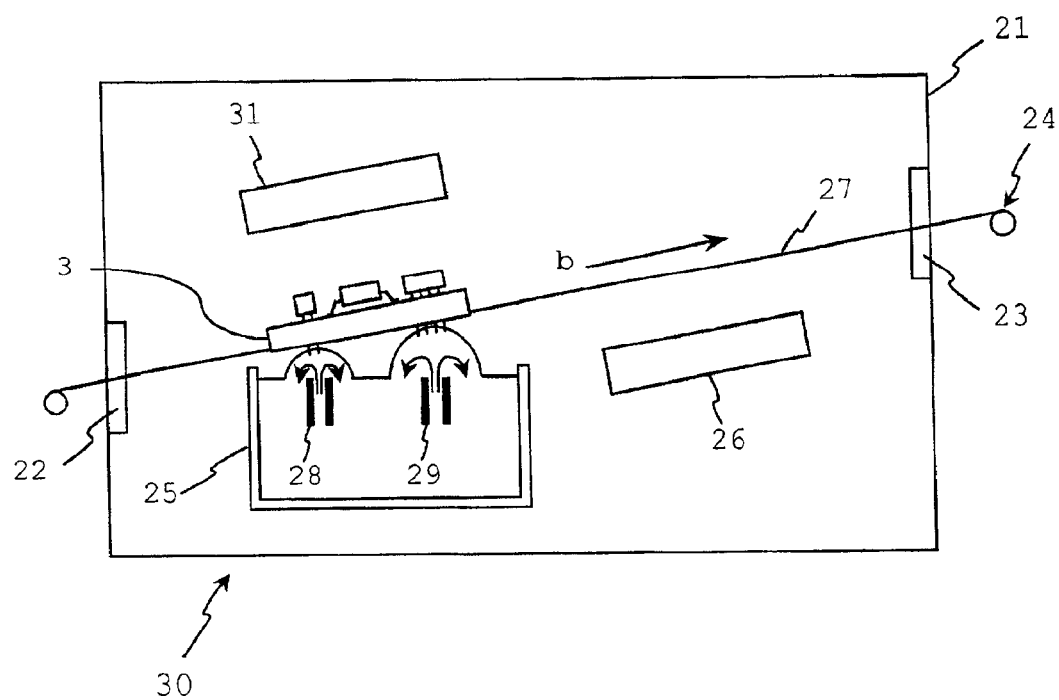
FIG. 8 is a diagram for explaining an exemplary method of adjusting the temperature of a portion of an electronic part connected by soldering, which has been previously mounted by reflowing on one side of a PCB during flow processing in a reflow/flow composite process.

Referring now to FIGS. 8 and 9, description will be made on a method of adjusting portions connected by soldering on the one side of PCB 3 to the aforementioned temperature during the flow processing in the reflow/flow composite process.

Flow apparatus 30 illustrated in FIG. 8 differs from flow apparatus 20 in FIG. 7 in that cooling unit 31 is additionally provided for cooling down PCB 3 from above. This cooling unit 31 can be implemented, for example, using a cooling fan, but any other configuration may be employed as long as it can send cooling air to PCB 3. Portions in FIG. 8 similar to those in FIG. 7 are designated the same reference numerals, and description thereon is omitted.

In the example illustrated in FIG. 8, the flow processing is performed while cooling unit 31 is blowing cooling air, from above, to portions connected by soldering of electronic parts which have been previously mounted on the one side of PCB 3 by reflowing. This prevents the temperature of the portions connected by soldering from rising due to the heat of the solder sprayed from solder bath 25. Unlike a furnace of a reflow apparatus, airtightness is not ensured within a furnace of a flow apparatus. Therefore, an N2 gas is preferably used as cooling air for preventing the solder stored within solder bath 25 from being oxidized by the cooling air.

Figure 9A:
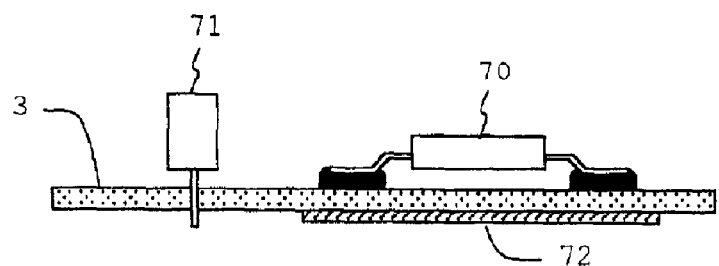
FIG. 9A is a diagram for explaining another exemplary method of adjusting the temperature of a portion of an electronic part connected by soldering, which has been previously mounted by reflowing on one side of a PCB during the flow processing in a reflow/flow composite process.
Figure 9B:
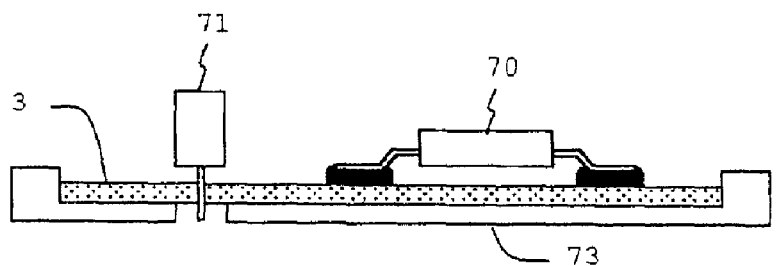
FIG. 9B is a diagram for explaining a further exemplary method of adjusting the temperature of a portion of an electronic part connected by soldering, which has been previously mounted by reflowing on one side of a PCB during the flow processing in a reflow/flow composite process.

In the examples illustrated in FIGS. 9A, 9B, the flow processing is performed with a thermally insulating material applied on the other side of PCB 3 to cover surface mounted part 70 previously mounted on the one side of PCB 3 from the other side. In this way, the heat of the solder sprayed from the nozzles of solder bath 25 is prevented from conducting to portions connected by soldering.

For example, in the example illustrated in FIG. 9A, masking tape 72 is adhered on the other side of PCB 3 as the thermal insulating material to cover surface mounted part 70, and the flow processing is performed in this state. A material suitable for masking tape 72 is that having a large thermal capacitance or a low thermal conductivity. For example, a paper tape, an aluminum tape or the like may be used for the purpose.

In the example illustrated in FIG. 9B, the flow processing is performed with PCB 3 placed on tray 73 which acts as the thermally insulating material. A material suitable for use as tray 73 is that having a large thermal capacity or that having a low thermal conductivity. Tray 73 is formed with openings corresponding to throughholes of PCB 3 through which leads of throughhole part 71 extend. The thermally insulating materials may be any alternatives other than the aforementioned masking tape and tray, as long as they limit the conduction of heat from the solder sprayed from solder bath 25.

Other methods substituted for the foregoing may involve increasing the conveying speed of PCB 3 by conveyer mechanism 24 (for example, to approximately 1.5 m/second, as compared with a standard conveying speed of 1.0 m/second), or modifying the double wave mode using nozzles 28, 29, typically employed in the flow processing, to a single wave mode using only the second jet stream (jet stream from nozzle 29). The aforementioned methods may be individually used alone, or may be used in combination.

As described above, the second embodiment sets the cooling speed of 1.5° C./second or higher for cooling units 13 of reflow apparatus 1 during the reflow processing on the one side of PCB 3, thereby suppressing the formation of a low-strength/low-melting point alloy layer due to the segregation of Sn—Zn—Pb (the melting point of which is 177° C.) and Sn—Pb—Bi (the melting point of which is 98° C.). This ensures the quality and reliability of solder-based bonding for electronic parts previously mounted on the one side of PCB 3.

Also, when an Sn—Zn—Bi based solder containing less than 3 wt % of Bi is used as a solder paste, it is possible to further suppress the segregation of Sn—Pb—Bi. Furthermore, when two or more kinds of solder powders are blended into an Sn—Zn—Bi based solder paste, the chip build-up defect can be suppressed.

In addition, the second embodiment maintains the temperature equal to or lower than 170° C. in portions connected by soldering of the electronic parts previously mounted by reflowing on the one side of PCB 3 during the flow processing, it is possible to prevent Sn—Zn—Pb existing in very small quantities on the one side of PCB 3 from melting again. This ensures the quality and reliability of solder-based bonding for the electronic parts previously mounted on the one side of PCB 3 even after PCB 3 undergoes the subsequent flow processing on the other side thereof.

While the foregoing embodiment has been applied to bonding of an electronic part having leads covered with a plating film containing Pb such as Sn—Pb, the present invention is also suitably applied for bonding other electronic parts which may contain Pb in locations to which a solder paste is applied.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a mount structure having a printed board and an electronic part, which contains Pb in the plating film of a lead, mounted on said printed board by soldering, said method comprising the steps of:
   a) applying a solder paste which comprise a Sn—Zn based alloy and contains less than 3% of Bi on said printed board, and loading said electronic part on said printed board through said solder paste;
   b) heating and melting said solder paste applied on said printed board; and
   c) forcedly cooling down said melted solder paste at a cooling speed in said range of 1.5° C./second to 3.3° C./second in the state where Pb contained in said plating film of said lead of said electronic parts begins to melt into solder paste by melting solder paste, to solidify said melted solder paste.

2. The manufacturing method according to claim 1, wherein said step b) includes heating said solder paste to 210° C. or higher.

3. The manufacturing method according to claim 1, wherein said step c) includes cooling down said solder paste to 190° C. or lower.

4. The manufacturing method according to claim 1, wherein said solder paste comprises two kinds or more of solder powders blended into a paste form.

5. The manufacturing method according to claim 1, further comprising the step of:
   after a first electronic part is mounted on one side of said printed board through said step a), said step b) and said step c), mounting a second electronic part on the other side of said printed board through said step a), said step b) and said step c),
   wherein said step c) for said second electronic part includes forcedly cooling down the solders on both sides of said printed board, said solders being melted in said step b) for said second electronic part, to solidify said solders.

6. The manufacturing method according to claim 1, further comprising the steps of:
   after mounting a first electronic part on one side of said printed board through said step a), said step b) and said step c), loading a second electronic part by inserting leads of said second electronic part through throughholes of said printed board from the one side of said printed board; and
   mounting said second electronic part by flowing while maintaining the solder applied on the one side of said printed board at temperatures of 170° C. or lower.

7. The manufacturing method according to claim 6, wherein said flow process includes adjusting the temperature of said solder by sending cooling air to said solder applied on one side of said printed board.

8. The manufacturing method according to claim 7, wherein said cooling air comprises an N2 gas.

9. The manufacturing method according to claim 6, wherein said flow process includes adjusting the temperature of said solder by disposing a thermally insulating material on the other side to cover the electronic part mounted on the one side of said printed board from the other side of said printed board.

10. The manufacturing method according to claim 9, wherein said thermally insulating material comprises a masking tape adhered on said printed board.

11. The manufacturing method according to claim 9, wherein said thermally insulating material comprises a tray on which said printed board is placed.

* * * * *